(12) United States Patent
Hwang

(10) Patent No.: US 8,828,756 B2
(45) Date of Patent: Sep. 9, 2014

(54) WAFER LEVEL LIGHT-EMITTING DEVICE PACKAGE AND METHOD OF MANUFACTURING THE SAME

(75) Inventor: Seong-deok Hwang, Seoul (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 126 days.

(21) Appl. No.: 13/240,418

(22) Filed: Sep. 22, 2011

(65) Prior Publication Data
US 2012/0181558 A1    Jul. 19, 2012

(30) Foreign Application Priority Data

Jan. 13, 2011    (KR) .................. 10-2011-0003553

(51) Int. Cl.
| | |
|---|---|
| *H01L 33/50* | (2010.01) |
| *H01L 33/00* | (2010.01) |
| *H01L 33/62* | (2010.01) |
| *H01L 33/48* | (2010.01) |
| *H01L 33/22* | (2010.01) |

(52) U.S. Cl.
CPC ......... *H01L 33/62* (2013.01); *H01L 2933/0066* (2013.01); *H01L 2924/0002* (2013.01); *H01L 33/486* (2013.01); *H01L 33/0079* (2013.01); *H01L 33/22* (2013.01)
USPC .......... 438/28; 257/98; 257/99; 257/E33.001; 257/E33.056; 257/E33.061

(58) Field of Classification Search
USPC .................. 257/59, 72, 79, 98, 99, 258, 291, 257/E27.133, E33.001, E33.056, E33.061, 257/774; 438/28
See application file for complete search history.

(56) References Cited

U.S. PATENT DOCUMENTS

| | | | |
|---|---|---|---|
| 2006/0231853 A1* | 10/2006 | Tanaka et al. ................... | 257/99 |
| 2008/0064142 A1 | 3/2008 | Gan et al. | |
| 2008/0124845 A1* | 5/2008 | Yu et al. ........................ | 438/143 |
| 2010/0096745 A1 | 4/2010 | Ruby et al. | |

FOREIGN PATENT DOCUMENTS

KR    10-2007-0004737    1/2007

* cited by examiner

*Primary Examiner* — Ori Nadav
*Assistant Examiner* — Ernest Allen, III
(74) *Attorney, Agent, or Firm* — McDermott Will & Emery LLP

(57) ABSTRACT

A wafer level light-emitting device package may include a polymer layer that bonds a light-emitting structure to a package substrate, and the polymer layer and the package substrate may include a plurality of via holes. Also, a method of manufacturing the wafer level light-emitting device package may include forming the polymer layer on the light-emitting structure, bonding the package substrate onto the polymer layer by applying heat and pressure, and forming a plurality of via holes in the polymer layer and the package substrate.

16 Claims, 10 Drawing Sheets

LIGHT

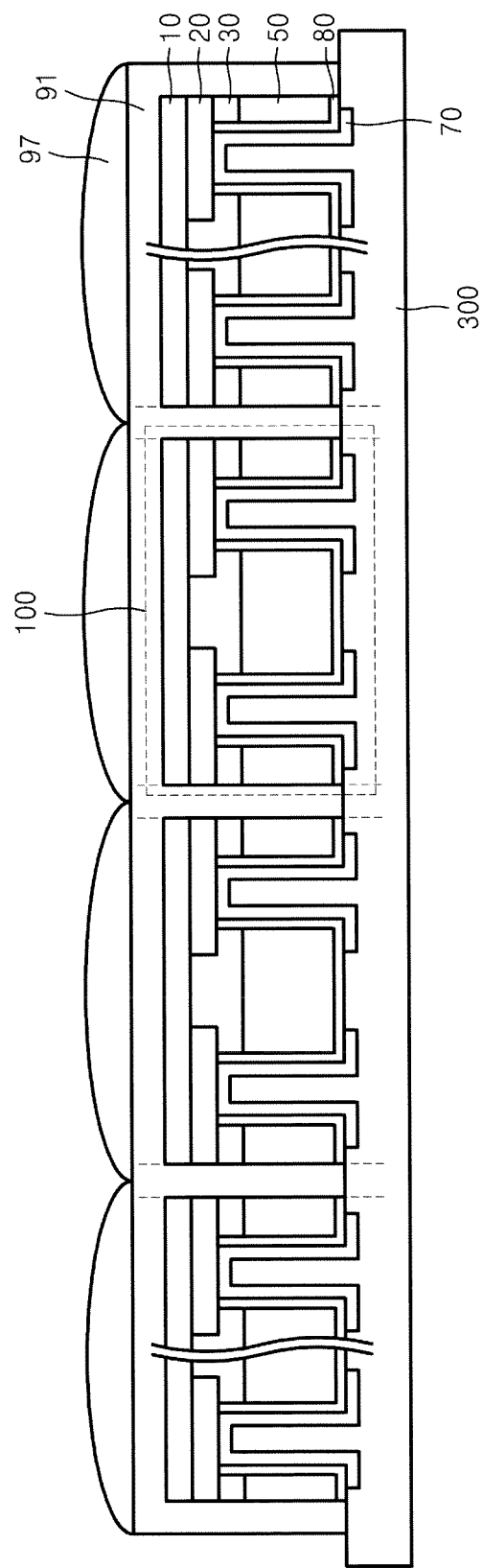

WAFER LEVEL LIGHT-EMITTING DEVICE PACKAGE AND METHOD OF MANUFACTURING THE SAME

CROSS-REFERENCE TO RELATED APPLICATIONS

This application claims the benefit of Korean Patent Application No. 10-2011-0003553, filed on Jan. 13, 2011, in the Korean Intellectual Property Office, the disclosure of which is incorporated herein in its entirety by reference.

BACKGROUND

1. Field

The present disclosure relates to wafer level light-emitting device packages and methods of manufacturing the same.

2. Description of the Related Art

Recent electronic parts are miniaturized and lightweight, as well as in a light-emitting diode (LED) field. One of the techniques that enable the electronic parts to be miniaturized and lightweight is a wafer level package. In a conventional semiconductor chip package technique, a subsequent process for forming a package is performed in a separate single chip unit. However, in the wafer level package technique, after forming a plurality of semiconductor chips on a wafer, a series of assembling processes for packaging the semiconductor chips are performed, and afterwards, final products are produced by cutting the wafer. Therefore, recently, studies regarding methods of manufacturing LEDs at a wafer level package have been actively performed

SUMMARY

Provided are wafer level light-emitting device packages and methods of manufacturing the same.

Additional aspects will be set forth in part in the description which follows and, in part, will be apparent from the description, or may be learned by practice of the presented embodiments.

According to an aspect of the present invention, there is provided a wafer level light-emitting device package including: a light-emitting structure; a plurality of electrode pads formed on an opposite surface of a surface of the light-emitting structure through which light is emitted; a polymer layer that is formed on the opposite surface of the light-emitting structure to cover the electrode pads and the light-emitting structure and includes a plurality of first via holes formed in regions of the polymer layer corresponding to the electrode pads; a package substrate that is formed on the polymer layer and includes a plurality of second via holes in regions of the package substrate corresponding to the first via holes; and a plurality of electrodes formed in the first and second via holes and electrically connected to the electrode pads.

The first via holes may be formed at locations corresponding to the electrode pads and may expose portions of the electrode pads.

The second via holes may be connected to the first via holes and may expose portions of the electrode pads.

The wafer level light-emitting device package may further include an insulating layer between inner walls of the first and second via holes and the electrode.

The polymer layer may be formed of a photosensitive polymer material.

The electrodes may be formed on inner walls of the first and second via holes and may be electrically connected to the electrode pads.

The electrodes may be formed by filling the first and second via holes with a conductive material and may be electrically connected to the electrode pads.

The light-emitting structure may further include a corrugated structure.

The wafer level light-emitting device package may further include at least one of a phosphor layer and an optical lens on the light-emitting structure.

The insulating layer may be formed of a photosensitive organic material.

The light-emitting structure may include: an n-type semiconductor layer; an active layer formed on the n-type semiconductor layer; and a p-type semiconductor layer formed on the active layer, wherein the electrode pads include: an n-type electrode pad separated from the active layer and the p-type semiconductor layer on the n-type semiconductor layer; and a p-type electrode pad on the p-type semiconductor layer.

The light-emitting structure may include: an n-type semiconductor layer; an active layer formed on the n-type semiconductor layer; and a p-type semiconductor layer formed on the active layer, wherein the electrode pads include: an n-type electrode pad separated from the active layer and the p-type semiconductor layer on the n-type semiconductor layer; and a p-type electrode pad on the p-type semiconductor layer, and the n-type semiconductor layer is connected to the n-type electrode pad through a first conductor filled in at least one via hole formed in the p-type semiconductor layer, the active layer, and a part of the n-type semiconductor layer, and the p-type semiconductor layer is connected to the p-type electrode pad through a second conductor formed on a lower surface of the p-type electrode pad.

According to another aspect of the present invention, there is provided a method of manufacturing a wafer level light-emitting device package, the method including: forming a light-emitting structure on a substrate; forming a plurality of electrode pads on an opposite surface of the light-emitting structure through which light is emitted and on a surface facing the surface of the light-emitting structure through which light is emitted; forming a polymer layer on a surface of the light-emitting structure to cover the electrode pads and the light-emitting structure; forming a plurality of first via holes in regions corresponding to the electrode pads in the polymer layer; bonding a package substrate onto the polymer layer; forming a plurality of second via holes in the package substrate in regions corresponding to the first via holes; forming an electrode connected to the electrode pads on an inner walls of the first and second via holes; removing the substrate from the light-emitting structure; and separating the light-emitting structure and the package substrate into a plurality of light-emitting device packages.

The forming of the first via holes may include exposing portions of the electrode pads through the first via holes.

The forming of the second via holes may include connecting the second via holes to the first via holes and exposing portions of the electrode pads through the first and second via holes.

The method may further include forming an insulating layer between inner walls of the first and second via holes and the electrodes.

The polymer layer may be formed of a photosensitive polymer material.

The second via holes may be formed by using a process selected from the group consisting of laser drilling, dry etching, and wet etching.

The removing of the substrate may be performed by using one of a laser lift-off method and a polishing method.

The method may further include forming a corrugated structure on the light-emitting structure by using one of an etching method and a photolithography method.

The method may further include forming a phosphor layer on the light-emitting structure prior to separating the light-emitting structure and the package substrate into a plurality of light-emitting device packages.

The method may further include forming an optical lens on the light-emitting structure prior to separating the light-emitting structure and the package substrate into the plurality of light-emitting device packages.

The insulating layer may be formed of a photosensitive organic material.

The forming of the insulating layer may include: covering the first and second via holes and the electrode pads with an insulating material; and exposing portions of the electrode pads by removing the insulating material formed on the electrode pads.

At least one of the forming of the light-emitting structure, the forming of the electrode pads, the forming of the first via holes, the bonding of the package substrate, the forming of the second via holes, the forming of the electrode, the removing of the substrate, and the separating of the light-emitting structure and the package substrate into a plurality of light-emitting device packages may be performed at a wafer level.

The forming of the phosphor layer may be performed at a wafer level.

The molding of the optical lens may be performed at a wafer level.

BRIEF DESCRIPTION OF THE DRAWINGS

These and/or other aspects will become apparent and more readily appreciated from the following description of the embodiments, taken in conjunction with the accompanying drawings of which:

FIGS. 7A through 7K are schematic cross-sectional views of a method of manufacturing a wafer level light-emitting device package, according to an embodiment of the present invention.

DETAILED DESCRIPTION

Figure 1:
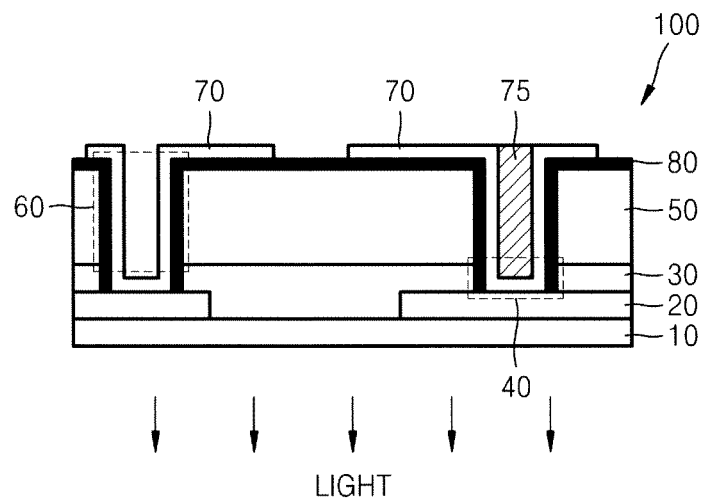
FIG. 1 is a schematic cross-sectional view of a wafer level light-emitting device package according to an embodiment of the present invention.

A wafer level light-emitting device package and a method of manufacturing the wafer level light-emitting device package according to the the present invention will now be described more fully with reference to the accompanying drawings. In the drawings, the thicknesses of layers and regions are exaggerated for clarity, and like reference numerals refer to the like elements.

FIG. 1 is a schematic cross-sectional view of a wafer level light-emitting device package 100 according to an embodiment of the present invention.

Referring to FIG. 1, the wafer level light-emitting device package 100 may include: a light-emitting structure 10, electrode pads 20 formed on an opposite surface of a surface of the light-emitting structure 10 through which light is emitted and on a surface facing the surface of the light emitting structure 10, a polymer layer 30 that is formed on the opposite surface of the light-emitting structure 10 to cover the electrode pads 20 and the light-emitting structure 10 and includes first via holes 40 formed in regions of the polymer layer 30 corresponding to the electrode pads 20; a package substrate 50 that is formed on the polymer layer 30 and includes second via holes 60 in regions of the package substrate 50 corresponding to the first via holes 40; and electrodes 70 formed in the first and second via holes 40 and 60 and electrically connected to the electrode pads 20.

Although not shown, the wafer level light-emitting device package 100 may include various types of light-emitting structures. The light-emitting structure 10 may include a nitride semiconductor diode formed of a Group III-V semiconductor compound, for example, GaN, InN, or AlN. The light-emitting structure 10 may be a stack structure of the Group III-V semiconductor compound. Also, the light-emitting structure 10 may include an n-type semiconductor layer, a p-type semiconductor layer, and an active layer formed between the n-type and p-type semiconductor layers.

A plurality of the electrode pads 20 may be formed on the opposite surface of the surface of the light-emitting structure 10 through which light is emitted. That is, the opposite surface of the light-emitting structure 10 may face the surface of the light-emitting structure 10 that light is emitted from. The electrode pads 20 may respectively include an n-type electrode pad and a p-type electrode pad.

The polymer layer 30 may be formed on the opposite surface of the light-emitting structure 10. The polymer layer 30 may cover regions of the opposite surface of the light-emitting structure 10 where the electrode pads 20 are not formed and portions of the electrode pads 20. The polymer layer 30 bonds the light-emitting structure 10 and the package substrate 50. The polymer layer 30 may be formed of a non-conductive polymer material, and in this case, both conductive and non-conductive wafers may be used as the package substrate 50. Also, the polymer layer 30 may be formed of a photosensitive polymer material. When the light-emitting structure 10 and the package substrate 50 are bonded using the polymer layer 30, the polymer layer 30 may mitigate a stress generated between the light-emitting structure 10 and the package substrate 50 due to a thermal expansion coefficient difference.

Also, a plurality of the first via holes 40 may be formed in the polymer layer 30, and the first via holes 40 may be formed in regions corresponding to the electrode pads 20. That is, the first via holes 40 may be formed at locations corresponding to the electrode pads 20, and may expose portions of the electrode pads 20. For example, as shown in FIG. 1, two first via holes 40 respectively may be formed at locations corresponding to the two electrode pads 20, and may respectively expose portions of the electrode pads 20.

The package substrate 50 may be formed on the polymer layer 30, and may be polymer bonded onto the polymer layer 30 by using a polymer bonding. The polymer bonding is a method of bonding two wafers by applying heat and pressure using a polymer as a bonding adhesive between the two wafers. When the polymer layer 30 is formed of a non-conductive polymer material, the package substrate 50 may be formed of various wafers without being limited by the conductivity or non-conductivity of the package substrate 50. The package substrate 50 may be formed of, for example, Si, undoped Si, SiAl, $Al_2O_3$, or AlN, and besides these, may be formed of a metal core printed circuit board (MCPCB).

Also, a plurality of second via holes 60 may be formed in the package substrate 50. The second via holes 60 may be formed in regions corresponding to the first via holes 40. That is, the second via holes 60 may be formed to be connected to the first via holes 40, and thus, the second via holes 60 and the first via holes 40 may look like a single via hole. Also, the second via holes 60 may expose the portions of the electrode pads 20 that are exposed through the first via holes 40. For example, as shown in FIG. 1, two second via holes 60 may be formed to be respectively connected to the two first via holes 40 respectively formed at location corresponding to the two electrode pads 20. Also, the two second via holes 60 respectively may expose the electrode pads 20. Here, the second via holes 60 may be formed by a process such as laser drilling, dry etching, or wet etching.

The electrodes 70 may be formed on inner walls of the first and second via holes 40 and 60, and may be electrically connected to the portions of the electrode pads 20 that are exposed through the first and second via holes 40 and 60. That is, the electrodes 70 may be electrically connected to the electrode pads 20 through the first and second via holes 40 and 60. Also, as shown in FIG. 1, the electrodes 70 may extend on a region on the package substrate 50. The electrodes 70 may be formed on the inner walls of the first and second via holes 40 and 60, and inner sides 75 of the first and second via holes 40 and 60 may be filled with a polymer material. Alternatively, the electrodes 70 may be formed by filling the inner sides 75 of the first and second via holes 40 and 60 with a conductive material.

The wafer level light-emitting device package 100 according to the current embodiment may further include an insulating layer 80 to electrically insulate the package substrate 50 from the electrodes when the package substrate 50 is formed of a conductive wafer. The insulating layer 80 may be formed on the inner walls of the first and second via holes 40 and 60 and the package substrate 50. The electrodes 70 may be formed on the insulating layer 80 to be insulated from the package substrate 50. Also, the insulating layer 80 may be removed from the surfaces of the electrode pads 20 that are exposed through the first and second via holes 40 and 60. That is, the insulating layer 80 is not formed on the exposed surfaces of the electrode pads 20 so that the electrodes 70 can be connected to the electrode pads 20. In this case, the electrodes 70 may be formed on the insulating layer 80 formed on the inner walls of the first and second via holes 40 and 60, and may extend on a region on the package substrate 50. The insulating layer 80 may be formed of an inorganic material such as an oxide material or a nitride material. Also, the insulating layer 80 may be formed of a photosensitive organic material, for example, polyimide. When the insulating layer 80 is formed of a photosensitive organic material, the formation of the insulating layer 80 in the first and second via holes 40 and 60 may be easy.

Figure 2:
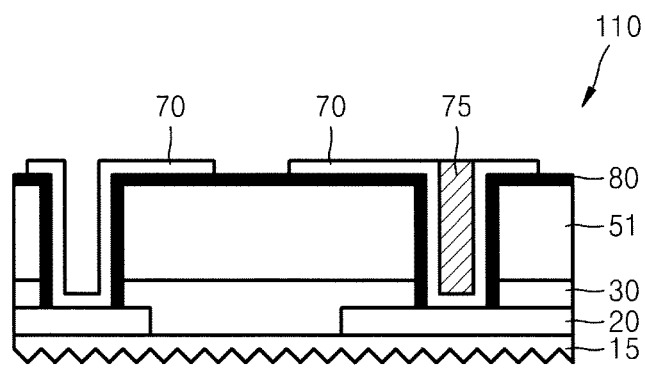
FIG. 2 is a schematic cross-sectional view of (a modified version of) a wafer level light-emitting device package according to a modified version of the embodiment of the present invention.

FIG. 2 is a schematic cross-sectional view of a wafer level light-emitting device package 110 according to a modified version of the embodiment of the present invention. Here, differences from the wafer level light-emitting device package 100 of FIG. 1 will be described.

Referring to FIG. 2, in the wafer level light-emitting device package 110, a light-emitting structure 15 may further include a corrugated structure. The corrugated structure may be an uneven pattern. The corrugated structure may be formed on a surface of the light-emitting structure 15 through which light is emitted, and may increase light extraction efficiency. In FIG. 2, the corrugated structure has a saw shape, but the present invention is not limited thereto. For example, the corrugated structure may have various shapes such as a square wave shape. The corrugated structure may be formed by an etching process or a photolithography process (using KOH). The etching process may use an etchant such as KOH.

Figure 3:
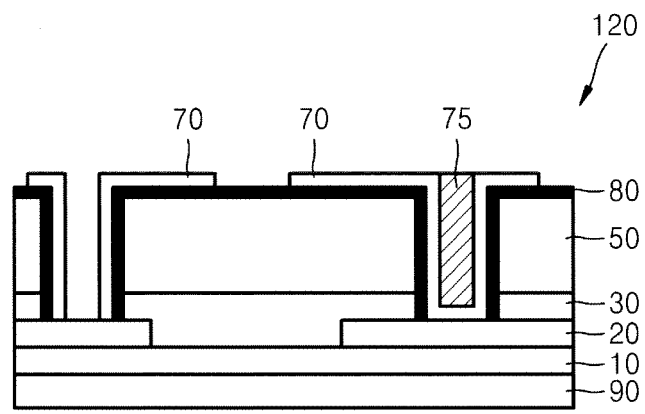
FIG. 3 is a schematic cross-sectional view of (a modified version of) a wafer level light-emitting device package according to a modified version of the embodiment of the present invention.

FIG. 3 is a schematic cross-sectional view of (a modified version of) a wafer level light-emitting device package 120 according to a modified version of the embodiment of the present invention. Here, differences from the wafer level light-emitting device package 100 of FIG. 1 will be described.

Referring to FIG. 3, the wafer level light-emitting device package 120 may further include a phosphor layer 90 on the light-emitting structure 10. The phosphor layer 90 may emit light in a visible ray region by absorbing light in an ultraviolet ray region. Also, the phosphor layer 90 may control light characteristics such as brightness and uniformity of light emitted from the light-emitting structure 10, and thus, may determine efficiency, lifetime, color rendering, and color reproducibility of the wafer level light-emitting device package 120. The phosphor layer 90 may include at least one of a red phosphor, a green phosphor, or a blue phosphor.

Figure 4:
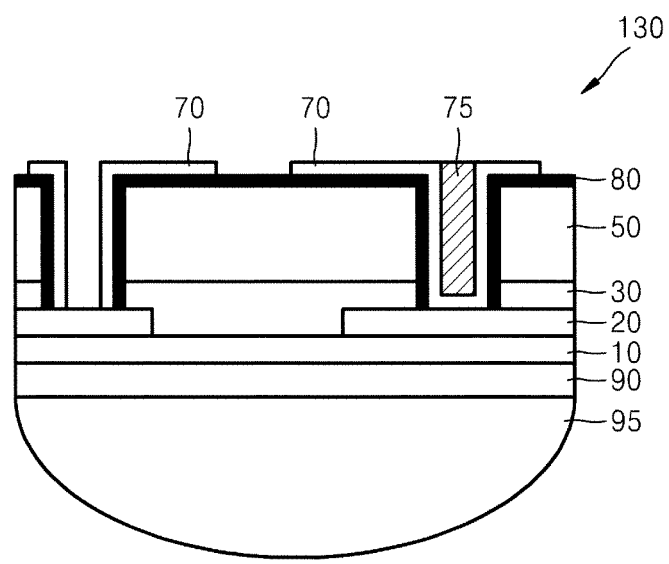
FIG. 4 is a schematic cross-sectional view of (a modified version of) a wafer level light-emitting device package according to a modified version of the embodiment of the present invention.

FIG. 4 is a schematic cross-sectional view of (a modified version of) a wafer level light-emitting device package 130 according to a modified version of the embodiment of the present invention. Here, differences from the wafer level light-emitting device package 100 of FIG. 1 will be described.

Referring to FIG. 4, the wafer level light-emitting device package 130 may further include an optical lens 95 on the light-emitting structure 10. The phosphor layer 90 may further be included between the light-emitting structure 10 and the optical lens 95. The optical lens 95 may focus or diffuse light emitted from the light-emitting structure 10. As shown in FIG. 4, the optical lens 95 may have a size corresponding to the size of the light-emitting structure 10. Although not shown, the optical lens 95 may be formed to have a size greater than the size of the light-emitting structure 10 to surround the wafer level light-emitting device package 130. The optical lens 95 may be molded on the light-emitting structure 10. Also, the optical lens 95 may be lenses of various shapes other than the semi-circle lens shown in FIG. 4, for example by changing a molding frame of the optical lens 95.

Figure 5:
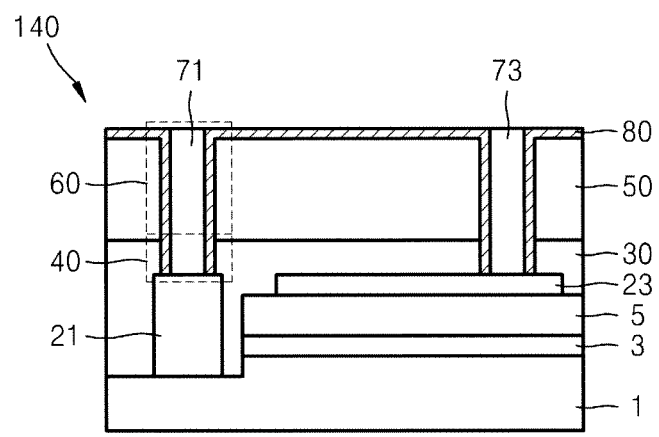
FIG. 5 is a schematic cross-sectional view of (a modified version of) a wafer level light-emitting device package according to a modified version of the embodiment of the present invention.

FIG. 5 is a schematic cross-sectional view of a modified version of a wafer level light-emitting device package 140 according to a modified version of embodiment of the present invention. In FIG. 5, the light-emitting structures 10 and 15 of the wafer level light-emitting device packages 100, 110, 120, and 130 of FIGS. 1 through 4 are depicted.

Referring to FIG. 5, the wafer level light-emitting device package 140 may include: a light-emitting structure, n-type and p-type electrode pads 21 and 23 formed on an opposite surface of a surface of the light-emitting structure through which light is emitted, the polymer layer 30 that is formed on the opposite surface of the light-emitting structure to cover the n-type and p-type electrode pads 21 and 23 and the light-emitting structure and includes the first via holes 40 formed on regions corresponding to the n-type and p-type electrode pads 21 and 23, the package substrate 50 that is formed on the polymer layer 30 and includes the second via holes 60 formed in regions corresponding to the first via holes 40, and n-type and p-type electrodes 71 and 73 that are formed in the first and second via holes 40 and 60 and are electrically connected to the n-type and p-type electrode pads 21 and 23, respectively.

In FIG. 5, the light-emitting structure included in the wafer level light-emitting device package 140 is exemplary. The light-emitting structure may include an n-type semiconductor layer 1, an active layer 3 formed on the n-type semiconductor layer 1, a p-type semiconductor layer 5 formed on the active layer 3. Also, the light-emitting structure may further include the n-type electrode pad 21 and the p-type electrode pad 23. The n-type electrode pad 21 may be separated from the active layer 3 and the p-type semiconductor layer 5 on the n-type semiconductor layer 1. Also, the p-type electrode pad 23 may be formed on the p-type semiconductor layer 5. The light-emitting structures 10 and 15 of the wafer level light-emitting device packages 100, 110, 120, and 130 of FIGS. 1 through 4 may include the light-emitting structure of FIG. 5.

The n-type semiconductor layer 1 may be formed of a nitride semiconductor doped with an n-type dopant. That is, the n-type semiconductor layer 1 may be formed of a semiconductor material having a composition expressed as $Al_xIn_yGa_{(1-x-y)}N$ (where, $0 \leq x \leq 1$, $0 \leq y \leq 1$, and $0 \leq x+y \leq 1$) by doping with an n-type dopant. The nitride semiconductor for forming the n-type semiconductor layer 1 may be, for example, GaN, AlGaN, or InGaN, and the n-type dopant may be, for example, Si, Ge, Se, or Te. The n-type semiconductor layer 1 may be grown by using a metal-organic chemical vapor deposition (MOCVD) method, a hydride vapor phase epitaxial (HVPE) method, or a molecular beam epitaxial (MBE) method.

The active layer 3 emits light having a predetermined energy by recombining electrons and holes. The active layer 3 may be formed of a semiconductor material having a combination expressed as $In_xGa_{1-x}N$ (where, $0 \leq x \leq 1$) to control a band gap energy according to the content of In. Also, the active layer 3 may be a multi-quantum well (MQW) layer in which quantum barrier layers and quantum well layers are alternately stacked.

The p-type semiconductor layer 5 may be a nitride semiconductor doped with a p-type dopant. That is, the p-type semiconductor layer 5 may be formed of a semiconductor material having a combination expressed as $Al_xIn_yGa_{(1-x-y)}N$ (where, $0 \leq x \leq 1$, $0 \leq y \leq 1$, and $0 \leq x+y \leq 1$) doped with a p-type dopant. The nitride semiconductor for forming the p-type semiconductor layer 5 may be, for example, GaN, AlGaN, or InGaN, and the p-type dopant may be, for example, Mg, Zn, or Be. The p-type semiconductor layer 5 may be grown by using a MOCVD method, a HVPE method, a MBE method. In FIG. 5, the active layer 3 is formed on the n-type semiconductor layer 1, and the p-type semiconductor layer 5 is formed on the active layer 3. However, in reverse, the active layer 3 may be formed on the p-type semiconductor layer 5, and the n-type semiconductor layer 1 may be formed on the active layer 3.

The n-type electrode pad 21 may be separately formed from the active layer 3 and the p-type semiconductor layer 5 on the n-type semiconductor layer 1. The p-type electrode pad 23 may be formed on the p-type semiconductor layer 5.

The polymer layer 30 is formed on an opposite surface of a surface of the light-emitting structure through which light is emitted. The polymer layer 30 may cover portions of the n-type semiconductor layer 1, the active layer 3, and the p-type semiconductor layer 5, and also, portions of the n-type and p-type electrode pads 21 and 23. The polymer layer 30 bonds the light-emitting structure to the package substrate 50.

Also, a plurality of first via holes 40 may be formed in the polymer layer 30. The first via holes 40 may be respectively formed in regions of the polymer layer 30 corresponding to the n-type and p-type electrode pads 21 and 23. The first via holes 40 may be respectively formed on the n-type and p-type electrode pads 21 and 23, and may expose portions of the n-type and p-type electrode pads 21 and 23. That is, the first via hole 40 formed at locations corresponding to the n-type electrode pad 21 exposes a portion of an upper surface of the n-type electrode pad 21, and the first via hole 40 formed at locations corresponding to the p-type electrode pad 23 may expose a portion of an upper surface of the p-type electrode pad 23.

The package substrate 50 may be formed on the polymer layer 30, and may be polymer bonded to the polymer layer 30 by being applied heat and pressure. A plurality of second via holes 60 may be formed in the package substrate 50. The second via holes 60 may be formed in regions of the package substrate 50 corresponding to the first via holes 40. That is, the second via holes 60 may be formed to be connected to the first via holes 40, and thus, the second via holes 60 and the first via holes 40 may look like a single via hole. Also, the second via holes 60 may expose the portions of the n-type and p-type electrode pads 21 and 23 that are exposed through the first via holes 40. That is, two second via holes 60 may be formed to be respectively connected electrically to the two first via holes 40 formed at locations corresponding to the n-type and p-type electrode pads 21 and 23. Also, the second via holes 60 may respectively expose portions of the n-type and p-type electrode pads 21 and 23. Here, the second via holes 60 may be formed by a process such as laser drilling, dry etching, or wet etching.

The n-type and p-type electrodes 71 and 73 may be formed by respectively filling a conductive material in the first and second via holes 40 and 60. The n-type and p-type electrodes 71 and 73 may be electrically connected to the portions of upper surfaces of the n-type and p-type electrode pads 21 and 23 that are exposed through the first and second via holes 40 and 60. That is, n-type and p-type electrodes 71 and 73 respectively may be electrically connected to the n-type and p-type electrode pads 21 and 23 through the first and second via holes 40 and 60.

The wafer level light-emitting device package 140 according to the current embodiment may further include an insulating layer 80 to electrically insulate the package substrate 50 from the n-type and p-type electrodes 71 and 73 when the package substrate 50 is formed of a conductive wafer. The insulating layer 80 may be formed on inner walls of the first and second via holes 40 and 60 and the package substrate 50. The n-type and p-type electrodes 71 and 73 may be formed on the insulating layer 80 and insulated from the package substrate 50. Also, portions of the insulating layer 80 may be removed on regions of the n-type and p-type electrode pads 21 and 23 that are exposed through the first and second via holes 40 and 60. That is, the insulating layer 80 is not formed on the upper surfaces of the n-type and p-type electrode pads 21 and 23 so that the n-type and p-type electrodes 71 and 73 respectively may be electrically connected to the n-type and p-type electrode pads 21 and 23.

Figure 6:
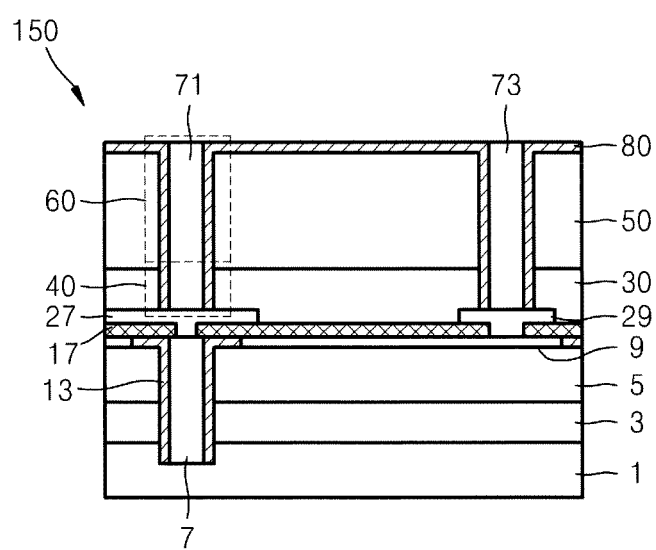
FIG. 6 is a schematic cross-sectional view of (a modified version of) a wafer level light-emitting device package according to a modified version of the embodiment of the present invention.

FIG. 6 is a schematic cross-sectional view of a modified version of a wafer level light-emitting device package 150 according to a modified version of the embodiment of the present invention. In FIG. 6, the light-emitting structures 10 and 15 of the wafer level light-emitting device package 100, 110, 120, and 130 of FIGS. 1 through 4 are depicted exemplary.

Referring to FIG. 6, the wafer level light-emitting device package 150 may include: a light-emitting structure, n-type and p-type electrode pads 27 and 29 formed on an opposite surface of a surface of the light-emitting structure through which light is emitted, the polymer layer 30 formed on the opposite surface of the light-emitting structure to cover the n-type and p-type electrode pads 27 and 29 and the light-emitting structure, a package substrate 50 formed on the polymer layer 30, and n-type and p-type electrodes 71 and 73 respectively electrically connected to the n-type and p-type electrode pads 27 and 29.

In FIG. 6 a light-emitting structure is exemplarily depicted in the wafer level light-emitting device package 150 according to the current embodiment. The light-emitting structure may include an n-type semiconductor layer 1, an active layer 3 formed on the n-type semiconductor layer 1, and a p-type semiconductor layer 5 formed on the active layer 3.

The n-type semiconductor layer 1 may be electrically connected to the n-type electrode pad 27 through a first conductor 7 disposed in at least one via hole formed in the p-type semiconductor layer 5, the active layer 3, and a portion of the n-type semiconductor 1. The first conductor 7 may be formed by filling the via hole with a conductive material. Also, the p-type semiconductor layer 5 may be electrically connected to the p-type electrode pad 29 through a second conductor 9 formed on a lower surface of the p-type electrode pad 29. Here, the second conductor 9 may be formed as a layer separate from the first conductor 7 and may reflect light emitted from the active layer 3.

A first insulating layer 13 may be formed on an inner wall of the via hole and on a region of an upper surface of the p-type semiconductor layer 5, and insulates the first conductor 7 from the second conductor 9. A second insulating layer 17 may be formed on regions of the first conductor 7 and the second conductor 9 and a region of the first insulating layer 13. However, the second insulating layer 17 may expose portions of upper surfaces of the first conductor 7 and the second conductor 9.

The n-type electrode pad 27 may be formed on the second insulating layer 17 on a region corresponding to the first conductor 7. That is, the n-type electrode pad 27 may be electrically connected to an exposed upper surface of the first conductor 7. The p-type electrode pad 29 may be formed on the second insulating layer 17 on a region corresponding to the second conductor 9. That is, the p-type electrode pad 29 may be electrically connected to an exposed upper surface of the second conductor 9.

The polymer layer 30 may be formed on a portion of the second insulating layer 17 and the n-type and p-type electrode pads 27 and 29, and may include a plurality of first via holes 40 formed in regions corresponding to the n-type and p-type electrode pads 27 and 29. The package substrate 50 is formed on the polymer layer 30 and may include a plurality of second via holes 60 in regions corresponding to the first via holes 40. The n-type and p-type electrode pads 27 and 29 respectively may be electrically connected to the n-type and p-type electrodes 71 and 73 formed in the first and second via holes 40 and 60. When the package substrate 50 is formed of a conductive wafer, an insulating layer 80 may further be included to electrically insulate the package substrate 50 from the n-type and p-type electrodes 71 and 73. The insulating layer 80 may be formed on inner walls of the first and second via holes 40 and 60 and on the package substrate 50. However, the insulating layer 80 is not formed on portions of upper surfaces of the n-type and p-type electrode pads 27 and 29 so that the n-type and p-type electrodes 71 and 73 respectively can be connected to the n-type and p-type electrode pads 21 and 23.

Also, the light-emitting structures 10 and 15 of the wafer level light-emitting device packages 100, 110, 120, and 130 of FIGS. 1 through 4 may include the light-emitting structure depicted in FIG. 6. The wafer level light-emitting device packages 100, 110, 120, and 130 may further include the first and second insulating layers 13 and 17 and the first and second conductors 7 and 9.

Hereinafter, a method of manufacturing a wafer level light-emitting device package, according to an embodiment of the present invention, will now be described.

Figure 7A:
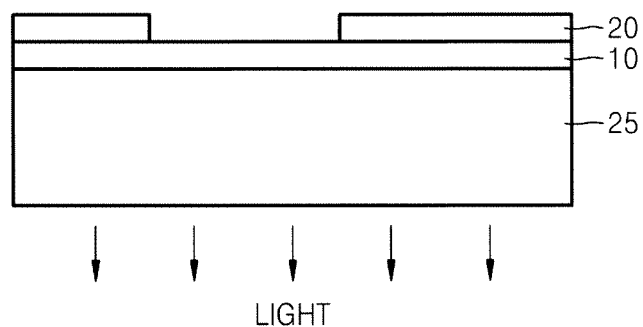
Figure 7B:
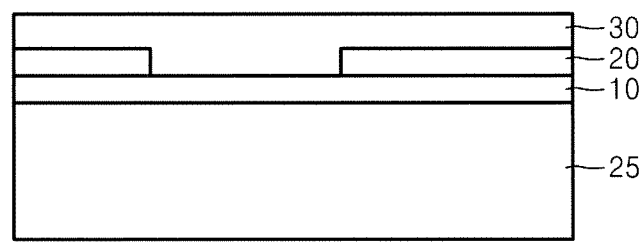
Figure 7C:
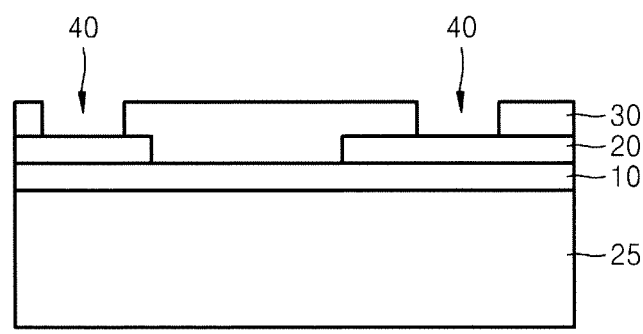
Figure 7D:
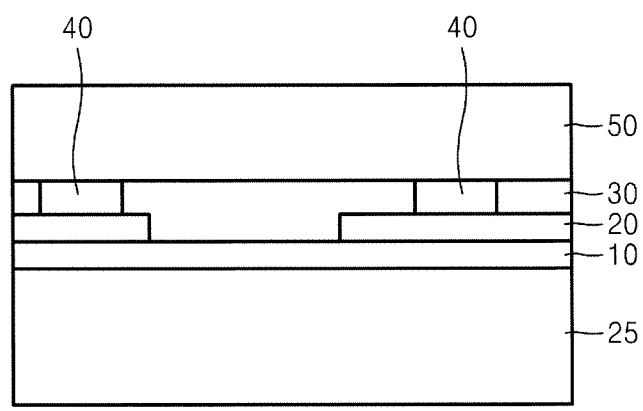
Figure 7E:
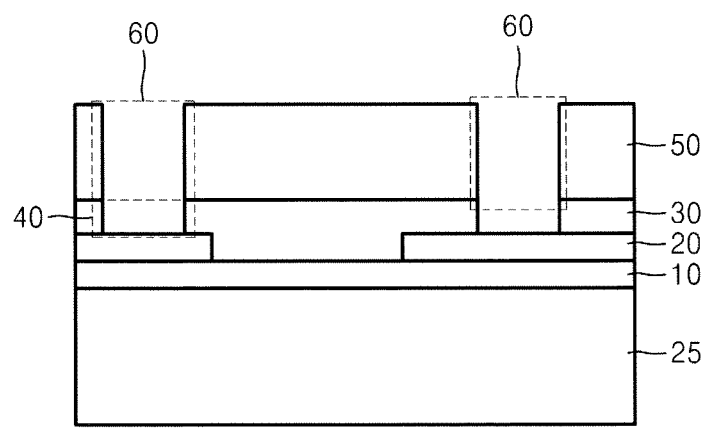
Figure 7F:
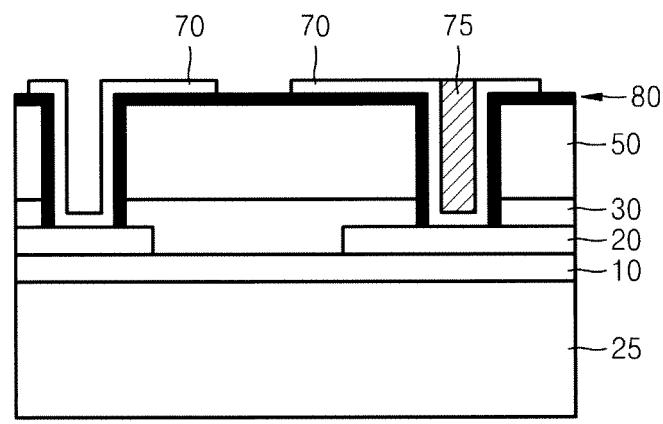
Figure 7G:
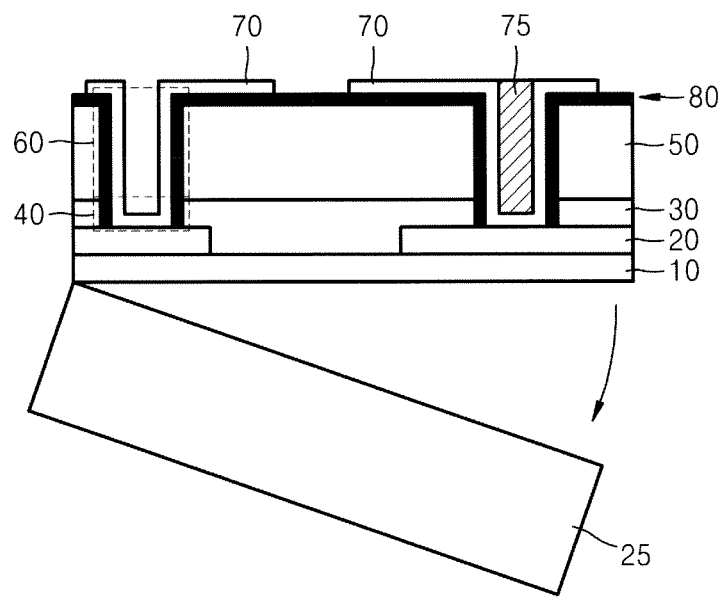
Figure 7H:
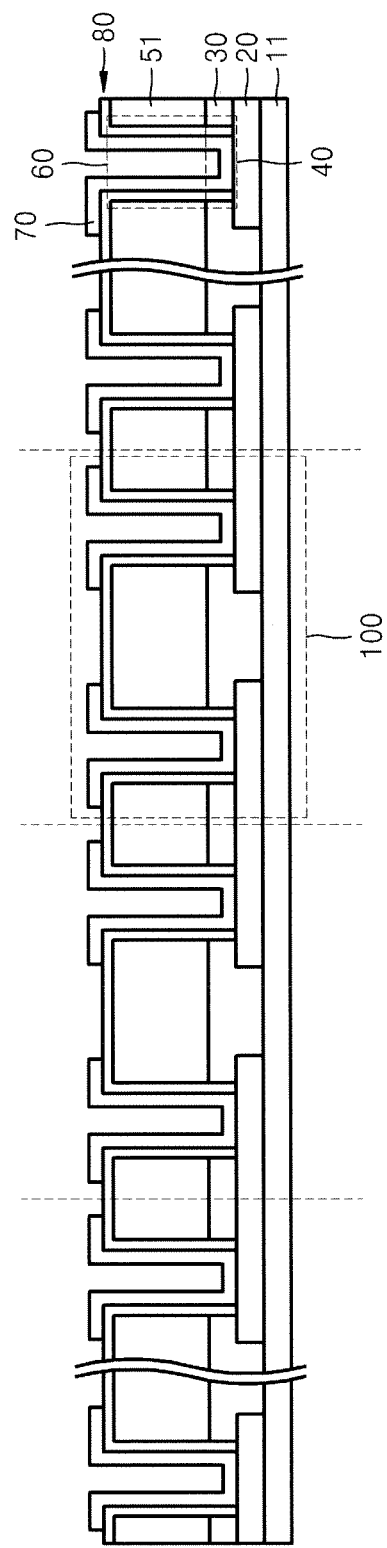

FIGS. 7A through 7K are schematic cross-sectional views of a method of manufacturing a wafer level light-emitting device package according to an embodiment of the present invention. Referring to FIG. 7A, a light-emitting structure 10 is formed on a substrate 25. That is, the light-emitting structure 10 may be formed on the substrate 25 using a conventional method of manufacturing a LED. The substrate 25 may be a sapphire substrate, a silicon carbide (SIC) substrate, a silicon substrate, or a gallium nitride (GaN) substrate. Although not shown, the light-emitting structure 10 may have a structure in which a plurality of semiconductor compound layers are stacked, and thus, may be formed by stacking a plurality of semiconductor compound layers on the substrate 25. For example, the light-emitting structure 10 may be formed by stacking Group III-V semiconductor compounds such as GaN, InN, or AlN on a sapphire substrate. Here, the substrate 25 may be a wafer type, and the light-emitting structure 10 may include a plurality of the light-emitting structures. That is, the light-emitting structure 10, as shown in FIG. 7H, may include a plurality of light-emitting structures 11, prior to being separated, formed on a wafer type package substrate 51.

A wafer level packaging process may be performed after forming the light-emitting structure 10 on the substrate 25. A plurality of electrode pads 20 may be formed on the light-emitting structure 10. The electrode pads 20 may be formed on an opposite surface of a surface of the light-emitting structure 10 through which light is emitted. The electrode pads 20 may respectively include, for example, n-type and p-type electrode pads.

Next, a polymer layer 30 may be formed on the light-emitting structure 10. Referring to FIG. 7B, the light-emitting structure 10 and the electrode pads 20 may be covered by forming the polymer layer 30 on the light-emitting structure 10 on which the electrode pads 20 are formed. The polymer layer 30 is formed to bond the light-emitting structure 10 to a package substrate 50 (refer to FIG. 7D) by using a polymer bonding method. The polymer layer 30 may be formed of a non-conductive polymer material, and in this case, the package substrate 50 may be formed of a conductive wafer or a non-conductive wafer.

Referring to FIG. 7C, a plurality of first via holes 40 are formed in the polymer layer 30. The first via holes 40 may be formed at regions corresponding to the electrode pads 20, and may be formed to expose portions of the electrode pads 20. When the polymer layer 30 is formed of a photosensitive polymer material, the first via holes 40 may be readily formed through a photosensitive process. Also, when the polymer layer 30 is formed of a photosensitive polymer material, problems such as undercut may be prevented in a subsequent process.

Referring to FIG. 7D, the package substrate 50 is bonded to the polymer layer 30 in which the first via holes 40 are formed. Here, the package substrate 50, as shown in FIG. 7H, may include the wafer type package substrate 51. The light-emitting structure 10 and the package substrate 50 may be bonded to each other by melting the polymer layer 30 by applying heat and pressure to the light-emitting structure 10 and the package substrate 50. When the polymer layer 30 is formed of a non-conductive polymer material, the package substrate 50 may be formed of various wafers without being limited by the conductivity or non-conductivity of the package substrate 50. Since the light-emitting structure 10 and the package substrate 50 are bonded by a polymer material, stress due to the thermal expansion coefficient difference between the light-emitting structure 10 and the package substrate 50 may be mitigated.

Referring to FIG. 7E, a plurality of second via holes 60 may be formed in the package substrate 50. The second via holes 60 may be formed in regions of the package substrate 50 corresponding to the first via holes 40, that is, may be formed to be connected to the first via holes 40. When the first and second via holes 40 and 60 are connected, the first and second via holes 40 and 60 may look like a single via hole. Also, the second via holes 60 may be formed to expose portions of the electrode pads 20 that are exposed through the first via holes 40. Here, the second via holes 60 may be formed in the package substrate 50 by a process such as laser drilling, dry etching, or wet etching.

Referring to FIG. 7F, electrodes 70 may be formed on inner walls of the first and second via holes 40 and 60. The electrodes 70 may be formed to be electrically connected to the portions of the electrode pads 20 that are exposed through the first and second via holes 40 and 60. That is, the electrodes 70 may be electrically connected to the electrode pads 20 through the first and second via holes 40 and 60. Also, the electrodes 70, as shown in FIG. 7F, may extend on regions on the package substrate 50. The electrodes 70 may be formed on the inner walls of the first and second via holes 40 and 60, and an inner space 75 of the first and second via holes 40 and 60 may be filled with a polymer material. Alternatively, the electrode 70 may be formed by filling the inner space 75 with a conductive material.

When the package substrate 50 is formed of a conductive wafer, an insulating layer 80 may further be formed prior to forming the electrode 70 to insulate the package substrate 50 from the electrode 70. The insulating layer 80 may be formed on the package substrate 50 and on the inner walls of the first and second via holes 40 and 60. However, the insulating layer 80 formed on portions of the electrode pads 20 that are exposed through the first and second via holes 40 and 60 is removed so that the electrode 70 can be electrically connected to the electrode pads 20. In this case, the electrode 70 may be formed on the insulating layer 80 formed on the inner walls of the first and second via holes 40 and 60, and may extend on regions of the insulating layer 80 on the package substrate 50. The insulating layer 80 may be formed of an inorganic material such as an oxide material or a nitride material. The insulating layer 80 may be formed of a photosensitive organic material, for example, polyimide. As in the current embodiment, when the insulating layer 80 is formed of an organic material, the insulating layer 80 may be readily formed on the inner wall of the first via hole 40 in the polymer layer 30.

Referring to FIG. 7G, the substrate 25 is removed by using a laser lift-off method, a grinding method, a polishing method, a lapping method, or an etching method. For example, when the substrate 25 is a sapphire substrate, the sapphire substrate may be removed from the light-emitting device package by using a laser lift-off method.

For convenience of explanation, the method of manufacturing a wafer level light-emitting device package is described in terms of a single light-emitting device package with reference to FIGS. 7A through 7G. However, all of the above processes may be performed in wafer levels. That is, referring to FIG. 7H, a plurality of wafer level light-emitting device packages 100 may be formed by separating a plurality of light-emitting structures 11 formed on a large area wafer type package substrate 51. Accordingly, the wafer level light-emitting device packages 100, 110, 120, 130, 140, and 150 of FIGS. 1 through 6 may be formed through wafer level processes. That is, the package substrate 50 may include the wafer type package substrate 51, and the light-emitting structure 10 may include light-emitting structures 11 prior to being separated.

After performing the above processes, the light-emitting structures 11 may be divided into individual light-emitting device package 100. Through the processes described above, the manufacture of the light-emitting device packages may be completed, and thus, an assembling process of the light-emitting device packages may be omitted. Also, the light-emitting device package 100 having the same size as that of a light-emitting device chip can be manufactured. Therefore, electronic products that employ the light-emitting device package 100 may be miniaturized and the degree of freedom of product design can be increased. In the case of a chip-on-board (COB) type light-emitting device package, after bonding a light-emitting device chip to a board and an electrical connection therebetween, a phosphor is coated. Accordingly, in a package level, it is difficult to measure characteristics of light emitted from the light-emitting device package, and thus, a rework is needed. However, in the case of the wafer level light-emitting device package 100, after evaluating light characteristics of each of the light-emitting device packages, the light-emitting device packages may be mounted in each binning.

Prior to separating the light-emitting structures 11 into individual wafer level light-emitting device packages 100, an additional process may further be performed to form constituent elements depicted in FIGS. 2 through 4. That is, in a wafer level, as shown in FIG. 2, the corrugated structure may further be formed on the light-emitting structure 15. The corrugated structure may be formed on a semiconductor compound of the light-emitting structure 15, and may increase light extraction efficiency of the light-emitting structure 15. In FIG. 2, the corrugated structure has a saw shape, but is not limited thereto, that is, the corrugated structure may have various shapes such as a square wave shape. The corrugated structure may be formed by an etching process or a photolithography process. The etching process may use an etchant such as KOH.

Also, as shown in FIG. 3, the phosphor layer 90 may further be formed on the light-emitting structure 10 in a wafer level. The phosphor layer 90 may be formed by coating a phosphor on the surface of the light-emitting structure 10 through which light is emitted. The phosphor layer 90 may emit light in a visible ray region by absorbing light in an ultraviolet ray region. Also, the phosphor layer 90 may control light characteristics such as brightness and uniformity of light emitted from the light-emitting structure 10, and thus, may determine efficiency, lifetime, color rendering, and color reproducibility of the wafer level light-emitting device package 120. The phosphor layer 90 may include at least one of a red phosphor, a green phosphor, or a blue phosphor.

Figure 7I:
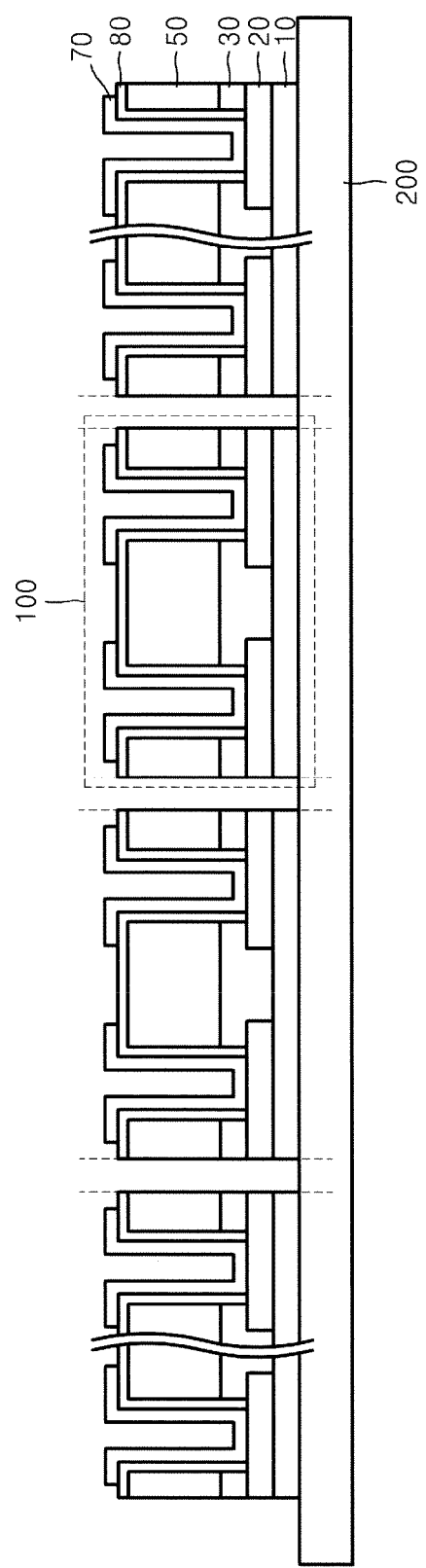
Figure 7J:
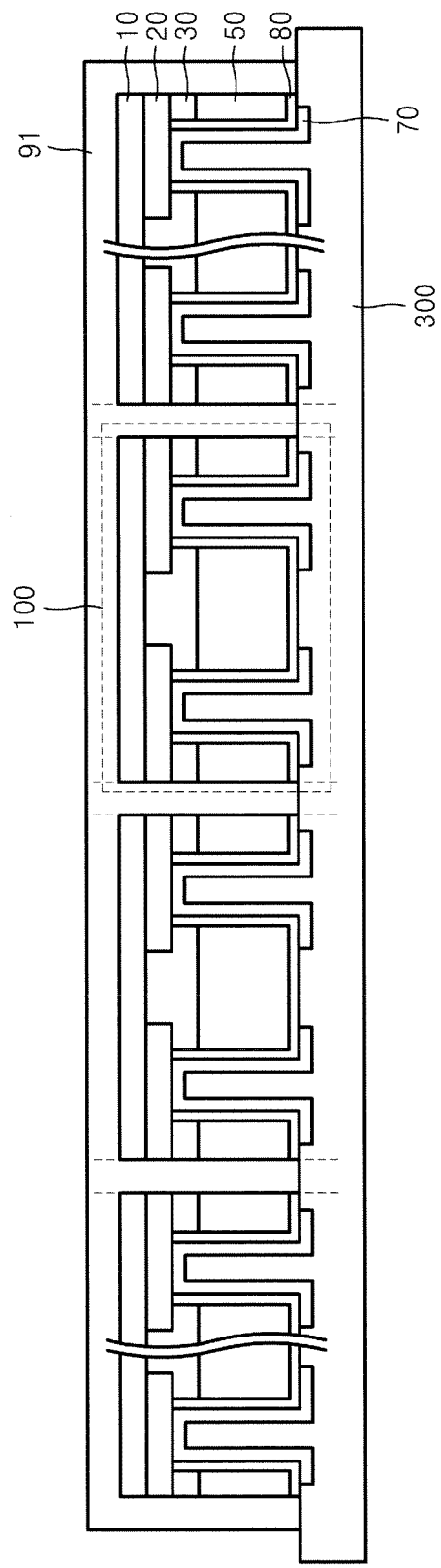

The phosphor layer 91, as shown in FIGS. 7I and 7J, may be formed through a tape expanding method. Referring to FIG. 7I, after disposing the light-emitting device packages 100 of FIG. 7H prior to being separated on an expanding tape 200, the light-emitting device packages 100 are separated into individual light-emitting device packages 100 by dicing or cutting the expanding tape 200. Here, the expanding tape 200 may be non-thermal resistance. When the expanding tape 200 is expanded, the light-emitting device packages 100 may be separated by a predetermined distance from each other.

Next, referring to FIG. 7J, the light-emitting device packages 100 separated by a predetermined distance are transferred to a thermally resistant carrier tape 300. Next, a phosphor layer 91 may be formed by coating and hardening a phosphor on the light-emitting device packages 100. In this case, the phosphor layer 91 may be formed on surfaces of the light-emitting device packages 100 through which light is emitted and on side surfaces thereof. After forming the phosphor layer 91, the light-emitting device packages 100 may be diced together with the phosphor layer 91. If the expanding tape 200 has thermal resistance, the processes described with reference to FIGS. 7I and 7J may be performed in a single process. That is, the thermally resistant expanding tape 200 is expanded to separate the light-emitting device packages 100 by a predetermined distance from each other without the need of transferring the light-emitting device packages 100 to the thermally resistant carrier tape 300. Afterwards, the phosphor layer 91 may be formed by coating and hardening a phosphor on the light-emitting device packages 100.

Referring to FIG. 7K, prior to separating the light-emitting device packages 100 into each of the light-emitting device packages 100, an optical lens 97 may further be formed on the phosphor layer 91. In this case, the optical lens 97 may be formed to have a size greater than that of the light-emitting structure 10, and thus, can control light emitted in lateral directions of the light-emitting structure 10.

Also, as shown in FIG. 4, an optical lens 95 may further be formed on the light-emitting structure 10 in a wafer level. Prior to forming the optical lens 95, the phosphor layer 90 may be formed on the light-emitting structure 10. The optical lens 95 may focus or diffuse light emitted from the light-emitting structure 10. As shown in FIG. 4, the optical lens 95 may have a size corresponding to the size of the light-emitting structure 10, or although not shown, may have a size greater than that of the light-emitting structure 10 to surround the light-emitting device package. Also, the optical lens 95 may be lenses of various shape other than the semi-circle lens shown in FIG. 4, for example, by changing a molding frame of the optical lens 95. According to the current embodiment, since the additional processes described above can be performed in a wafer level, the conventional assembling process of light-emitting device packages can be omitted, and after evaluating optical characteristics of each of the light-emitting device packages, the light-emitting device packages can be mounted in each binning.

While a wafer level light-emitting device package and a method of manufacturing the same according to the present invention have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a wafer level light-emitting device package, the method comprising:
    forming a light-emitting structure on a substrate;
    forming a plurality of electrode pads on a first surface of the light-emitting structure opposite to a second surface of the light-emitting structure through which light is emitted;
    forming a polymer layer on the first surface of the light-emitting structure to cover the electrode pads and the light-emitting structure;
    forming a plurality of first via holes in regions corresponding to the electrode pads in the polymer layer;
    bonding a package substrate onto the polymer layer, wherein the plurality of the first via holes in the polymer layer are substantially empty when the package substrate is bonded onto the polymer layer;
    forming a plurality of second via holes in the package substrate in regions corresponding to the first via holes;
    forming a plurality of electrodes connected to the electrode pads on inner walls of the first and second via holes;
    removing the substrate from the light-emitting structure; and
    separating the light-emitting structure and the package substrate into a plurality of light-emitting device packages.

2. The method of claim 1, wherein the forming of the first via holes comprises exposing portions of the electrode pads through the first via holes.

3. The method of claim 1, wherein the forming of the second via holes comprises connecting the second via holes to the first via holes and exposing the portions of the electrode pads through the first and second via holes.

4. The method of claim 1, further comprising forming an insulating layer between inner walls of the first and second via holes and the electrodes.

5. The method of claim 1, wherein the polymer layer is formed of a photosensitive polymer material.

6. The method of claim 1, wherein the second via holes are formed by using a process selected from the group consisting of laser drilling, dry etching, and wet etching.

7. The method of claim 1, wherein the removing of the substrate is performed by using one of a laser lift-off method and a polishing method.

8. The method of claim 1, further comprising forming a corrugated structure on the light-emitting structure by using one of an etching method and a photolithography method.

9. The method of claim 1, further comprising forming a phosphor layer on the light-emitting structure prior to separating the light-emitting structure and the package substrate into a plurality of light-emitting device packages.

10. The method of claim 1, further comprising forming an optical lens on the light-emitting structure prior to separating the light-emitting structure and the package substrate into the plurality of light-emitting device packages.

11. The method of claim 4, wherein the insulating layer is formed of a photosensitive organic material.

12. The method of claim 4, wherein the forming of the insulating layer comprises: covering the first and second via holes and the electrode pads with an insulating material; and exposing portions of the electrode pads by removing the insulating material formed on the electrode pads.

13. The method of claim 1, wherein at least one of the forming of the light-emitting structure, the forming of the electrode pads, the forming of the first via holes, the bonding of the package substrate, the forming of the second via holes, the forming of the electrodes, and the removing of the substrate prior to separating the light-emitting structure and the package substrate into the plurality of light-emitting device packages.

14. The method of claim 9, wherein the forming of the phosphor layer is performed prior to separating the light-emitting structure and the package substrate into the plurality of light-emitting device packages.

15. The method of claim 1, wherein the bonding the package substrate onto the polymer layer is performed prior to forming the plurality of second via holes in the package substrate.

16. The method of claim 1, wherein the forming the plurality of electrodes on inner walls of the first via holes is performed after the bonding the package substrate onto the polymer layer.

* * * * *